(12) United States Patent
Fang

(10) Patent No.: US 11,699,850 B2
(45) Date of Patent: *Jul. 11, 2023

(54) METHOD AND APPARATUS FOR BEAM STEERING AND SWITCHING

(71) Applicant: Metawave Corporation, Palo Alto, CA (US)

(72) Inventor: Jun Fang, Palo Alto, CA (US)

(73) Assignee: METAWAVE CORPORATION, Carlsbad, CA (US)

( * ) Notice: Subject to any disclaimer, the term of this patent is extended or adjusted under 35 U.S.C. 154(b) by 1118 days.

This patent is subject to a terminal disclaimer.

(21) Appl. No.: 16/265,905

(22) Filed: Feb. 1, 2019

(65) Prior Publication Data

US 2019/0237868 A1  Aug. 1, 2019

Related U.S. Application Data

(60) Provisional application No. 62/625,233, filed on Feb. 1, 2018.

(51) Int. Cl.
| | | |
|---|---|---|
| H01Q 3/28 | (2006.01) | |
| H01Q 1/24 | (2006.01) | |
| H01Q 1/36 | (2006.01) | |
| H04B 1/44 | (2006.01) | |
| H04B 7/0426 | (2017.01) | |

(Continued)

(52) U.S. Cl.
CPC .............. *H01Q 3/28* (2013.01); *H01Q 1/246* (2013.01); *H01Q 1/364* (2013.01); *H03F 1/02* (2013.01); *H03F 3/211* (2013.01); *H04B 1/44* (2013.01); *H04B 7/043* (2013.01)

(58) Field of Classification Search
CPC ...... H01Q 1/248; H01Q 1/44; H01Q 15/0086; H01Q 1/246; H01Q 1/364; H01Q 25/00; H01Q 3/24; H01Q 3/40
USPC .......................................................... 455/98
See application file for complete search history.

(56) References Cited

U.S. PATENT DOCUMENTS

| | | | | |
|---|---|---|---|---|
| 5,854,611 A | * | 12/1998 | Gans ....................... | H01Q 23/00 342/373 |
| 2008/0258993 A1 | * | 10/2008 | Gummalla ............. | H01Q 1/243 343/876 |

(Continued)

OTHER PUBLICATIONS

Kai Yao et al., "Design of an Active Scalable Phased Array Antenna System." Department of Microwave Engineering Harbin Institute of Technology Harbin, China; IEEE URSI, pp. 31-32, 2019.

(Continued)

*Primary Examiner* — Ajibola A Akinyemi
(74) *Attorney, Agent, or Firm* — Sandra Lynn Godsey

(57) ABSTRACT

Systems, methods, and apparatus for beam steering and switching are disclosed. In one or more examples, a method for operating a communication system comprises switching, at least one switch in a rearrangeable switch network, to control input levels to power amplifiers in a power distribution network. The method further comprises outputting, by the power amplifiers in the power distribution network, power to a plurality of antenna elements. Further, the method comprises steering and distributing power, by the antenna elements, in beams associated with each of the antenna elements according to a level of the power in each of the antenna elements.

16 Claims, 11 Drawing Sheets

(51) Int. Cl.
  *H03F 1/02* (2006.01)
  *H03F 3/21* (2006.01)

(56) References Cited

U.S. PATENT DOCUMENTS

| | | | | |
|---|---|---|---|---|
| 2012/0063195 A1* | 3/2012 | Lam | ................... | G11C 11/5678 |
| | | | | 365/148 |
| 2013/0257659 A1* | 10/2013 | Darnell | ................. | H05K 1/028 |
| | | | | 343/702 |
| 2018/0070157 A1* | 3/2018 | Menard | ................. | H04Q 11/02 |
| 2018/0227043 A1* | 8/2018 | Dankberg | ............ | H04B 7/2046 |
| 2019/0028137 A1* | 1/2019 | O'Neill | ................... | H04B 1/44 |

OTHER PUBLICATIONS

Angeletti, Piero et al.,"A survey of multiport power amplifiers applications for flexible satellite antennas and payloads," The 14th Ka and Broadband Communications Conference, 2008.
C. Rave and A. F. Jacob, "Architectures for efficient power sharing in active multiple-feed-per-beam satellite antennas," 2016, 21st International Conference on Microwave, Radar and Wireless Communications (MIKON), pp. 1-4, 2016.

* cited by examiner

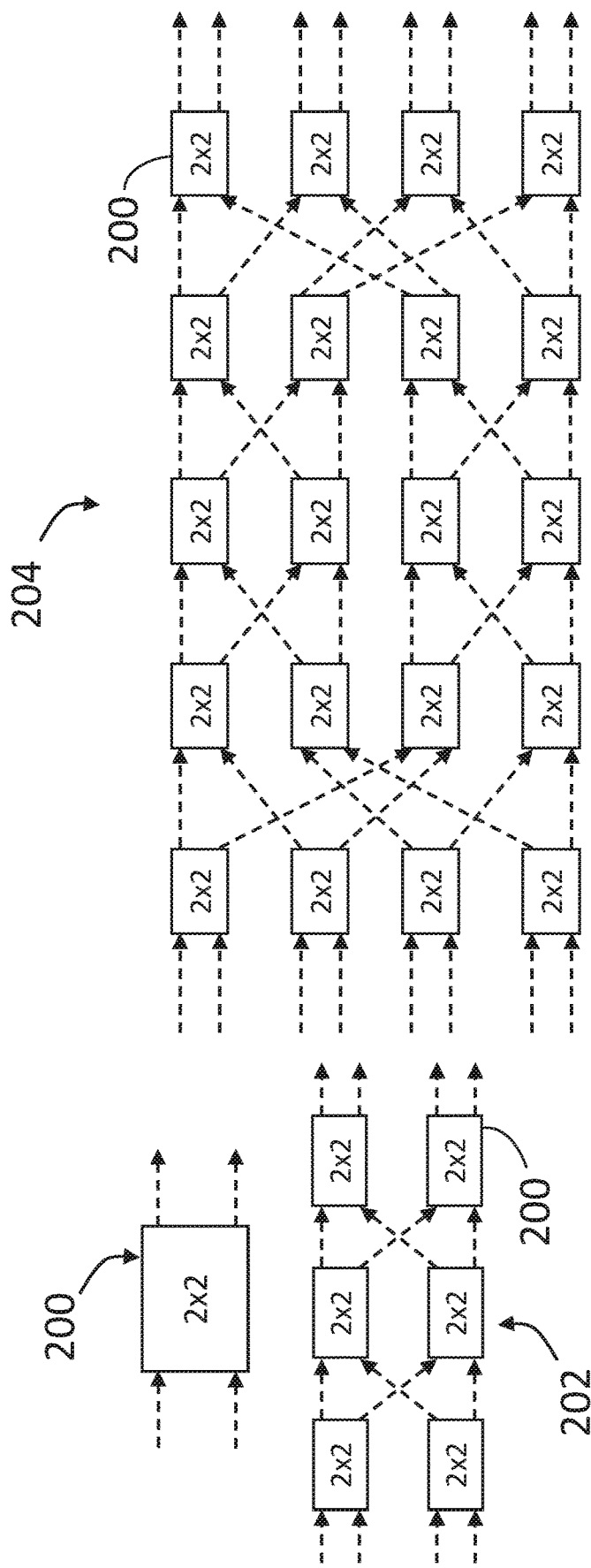

METHOD AND APPARATUS FOR BEAM STEERING AND SWITCHING

CROSS REFERENCE TO RELATED APPLICATION

This application claims priority to, and the benefit of, U.S. Provisional Patent Application No. 62/625,233, filed on Feb. 1, 2018, the entire disclosure of which is expressly incorporated by reference herein.

FIELD

The present disclosure relates to wireless communication systems, and specifically to phased-array antennas.

BACKGROUND

Electronically steerable antennas, such as scanning antennas, have many uses, as they provide high directivity gain. These have a need for power control methods to reduce loss. As such, there is a need for an improved technology for beam steering and switching for steerable antennas.

SUMMARY

The present disclosure relates to methods, systems, and apparatuses for beam steering and switching. In one or more examples, a communication system comprises a transceiver module and a rearrangeable switch network coupled to the transceiver module. The system further comprises a power distribution network coupled to the rearrangeable switch network. Further, the system comprises a plurality of antenna elements, each coupled to the power distribution network.

In one or more examples, the rearrangeable switch network comprises a Benes network. In at least one example, the rearrangeable switch network comprises C-switches, R-switches, T-switches, or cross-bar switches.

In at least one example, the system further comprises a bank of level control drivers connected to the rearrangeable switch network.

In one or more examples, the power distribution network is a Multi-Port Amplification (MPA) matrix or system comprising a first set of hybrid couplers, a second set of hybrid couplers coupled to the plurality of antenna elements, and a power amplifier bank connected to the first set of hybrid couplers and the second set of hybrid couplers.

In at least one example, the first set of hybrid couplers and the second set of hybrid couplers both comprise ninety-degree hybrid couplers. In some examples, the first set of hybrid couplers and the second set of hybrid couplers each comprise M number of inputs and M number of outputs.

In one or more examples, the power amplifier bank comprises High Power Amplifiers (HPAs). In some examples, the HPAs are Traveling Wave Tube Amplifiers (TWTAs) or Solid State Power Amplifiers (SSPAs).

In at least one example, the power amplifier bank comprises at least one redundant power amplifier.

In one or more examples, at least one of the antenna elements transmit or receive Electromagnetic (EM) signals in beams. In some examples, the electromagnetic signals comprise L-band, S-band, C-band, X-band, Ku-band, Ka-band, and Q/V-band frequencies.

In at least one example, the antenna elements are phased-array antenna elements. In some examples, the antenna elements comprise at least one Metastructure, such as a Metamaterial (MTM).

In one or more examples, the system is employed in a satellite or a cellular base station. In some examples, the satellite is a Low Earth Orbit (LEO) satellite, a Medium Earth Orbit (MEO) satellite, or a Geosynchronous Earth Orbit (GEO) satellite.

In at least one example, a method for operating a communication system comprises switching, at least one switch in a rearrangeable switch network, to control input levels to power amplifiers in a power distribution network. The method further comprises outputting, by the power amplifiers in the power distribution network, power to a plurality of antenna elements. Further, the method comprises steering and distributing power, by the antenna elements, in beams associated with each of the antenna elements according to a level of the power in each of the antenna elements.

In one or more examples, the rearrangeable switch network, the power distribution network, and the antenna elements are on a satellite or a cellular base station. In some examples, the satellite is a LEO satellite, a MEO satellite, or a GEO satellite.

In at least one example, the method further comprises transmitting at least one of the beams to a satellite.

In one or more examples, a power distribution network for a communication system comprises a first set of hybrid couplers coupled to a rearrangeable switch network. The network further comprises a second set of hybrid couplers coupled to a plurality of antenna elements. Further, the network comprises a power amplifier bank connected to the first set of hybrid couplers and the second set of hybrid couplers.

DRAWINGS

These and other features, aspects, and advantages of the present disclosure will become better understood with regard to the following description, appended claims, and accompanying drawings, which are not drawn to scale and in which like reference characters refer to like parts throughout, and where:

FIGS. 2 and 3 illustrate switch networks, according to examples of the present disclosure.

DESCRIPTION

Figure 1:
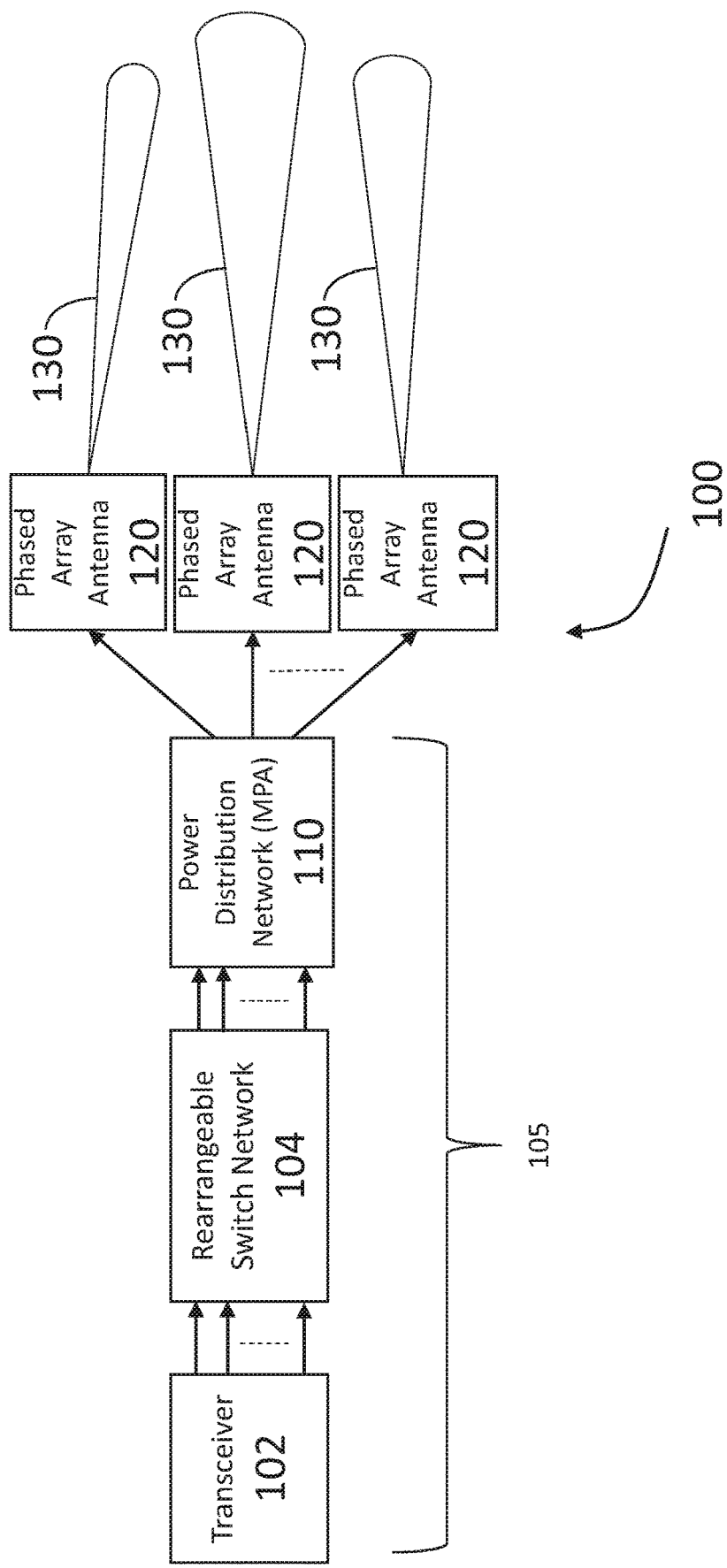
FIG. 1 illustrates an antenna system, according to examples of the present disclosure.

The methods and apparatuses disclosed herein provide an operative system for beam steering and switching. In one or more examples, the system of the present disclosure utilizes a phased-array antenna to enable beamforming by using multiple elements to support high gain, while enabling narrow beam formation. In particular, the present disclosure provides methods and apparatuses employing a Multi-Port Amplification (MPA) matrix to control power distribution for the phased-array antenna. This enables smart control of the antenna to optimize operation and reduce losses. These MPA matrices may be used for power distribution in various system configurations, including a Multi-User Multiple-Input, Multiple-Output (MU-MIMO) system configurations.

Phased array antennas provide high directional gain and narrow beams, enabling very high data rate spatial transmission in satellite communications, and in particular, in broadband mobile satellite systems, where satellites can move in orbits and communicate with ground stations, stationary or in mobility. Beams formed by satellite phased-array antennas are steered by a certain angle to find ground stations as the communication satellite moves, such as for Satellite Communications on the Move (SOTM). When beams are electronically steered, there may be a gain loss observed. Larger steering angles result in higher gain loss. These losses may be compensated by adjusting the power using a power amplifier, which in the disclosed examples is part of a MPA matrix or system. This MPA system provides power level control, failure resilience, and power combining/dividing capabilities over a range of complex operational requirements. In multiple beam operations of the SOTM systems, beam handover is required when satellites move in beam operations of the SOTM systems. Beam handover is required when satellites move in or out of the sight of a ground station. Beam swapping can be performed for the handover procedure where a new beam is formed and steered to a new ground station which takes over another beam pointing to another ground station which is about to become out of sight of the satellite. The present disclosure proposes and discloses a method using beam switching with a Benes network topology to support seamless handover scenarios.

When beams are electronically steered, a gain loss is usually observed, which is proportional to $\cos(\theta)$, with $\theta$ the steering angle. The larger the steering angle, the higher the gain loss will be. At the same time, the larger the steering angle, the farther the distance between the satellite and the ground station, or terminal. In space propagation, the propagation loss is increased by six (6) dB when the distance is doubled. For example, for a Low Earth Orbit (LEO) satellite moving in its orbit at an elevation angle of thirty degrees (30°), the beam steering loss is about three (3) decibels (dB) and the LEO-terminal distance as doubled implies about six (6) dB path loss, thereby totalizing a loss of up to nine (9) dB. These losses can be compensated by adjusting the power, as one of the most effective possible solutions, by using an MPA matrix. The proposed solution based on an MPA system provides power level control, failure resilience, and power combining/dividing features to meet very complex operational requirements.

In the following description, numerous details are set forth in order to provide a more thorough description of the system. It will be apparent, however, to one skilled in the art, that the disclosed system may be practiced without these specific details. In the other instances, well known features have not been described in detail, so as not to unnecessarily obscure the system.

Examples of the present disclosure may be described herein in terms of functional and/or logical components and various processing steps. It should be appreciated that such components may be realized by any number of hardware, software, and/or firmware components configured to perform the specified functions. For example, the present disclosure may employ various integrated circuit components (e.g., memory elements, digital signal processing elements, logic elements, look-up tables, or the like), which may carry out a variety of functions under the control of one or more processors, microprocessors, or other control devices. In addition, those skilled in the art will appreciate that examples of the present disclosure may be practiced in conjunction with other components, and that the systems described herein are merely examples that may be employed of the present disclosure.

For the sake of brevity, conventional techniques and components related to beam steering and switching, and other functional aspects of the systems (and the individual operating components of the systems) may not be described in detail herein. Furthermore, the connecting lines shown in the various figures contained herein are intended to represent example functional relationships and/or physical couplings between the various elements. It should be noted that many alternative or additional functional relationships or physical connections may be present in one or more examples of the present disclosure.

It should be noted that antennas used in space applications, such as satellites, require large-scale beamforming with high directivity gain. These antennas are often designed for beam steering and beam switching, where power control is a key consideration. The goal is to distribute power to the individual antenna elements and to control individual antenna elements (or groups of antenna elements) with individualized power levels.

Electronic beam steering eliminates mechanical beam steering, and thereby reduces mass, volume, and power for controlling and operating subsystems and antenna arrays. For example, for low earth orbital (LEO) satellites, the control steers the antenna beams to point to ground stations, including gateways and terminals. As a beam is steered, its gain degrades. In particular, the larger the steered angle of a beam, the more degradation results. For continuity of link connectivity, the disclosed system controls the antenna gain to compensate for this degradation. For example, when a LEO satellite's movement takes its beams in and out of a line of sight of a ground station, the control switches the beams to communicate among multiple ground stations. The system of the present disclosure provides power control for these and other scenarios. For example, in one or more examples, the system of the present disclosure distributes power to different antenna elements with different and controllable power levels, updates the power levels for beams, and switches beams between antennas in handover events.

FIG. 1 illustrates an antenna system 100, according to examples of the present disclosure. In one or more examples of the present disclosure, for a satellite (e.g., refer to 600 of FIG. 6A) with several links pointing to several different ground stations (e.g., refer to 620 of FIG. 6A), a power switching and distribution network 105, as in FIG. 1, may be employed. The power switching and distribution network 105 may comprise a transceiver 102, a rearrangeable switch network 104, and a power distribution network 110. The power distribution network 110 is coupled to a plurality of phased-array antennas 120, which each transmit (radiate) and/or receive (detect) Electromagnetic (EM) beams 130. In one or more examples, the phased-array antennas 120 may be manufactured to comprise a Metastructure, such as a Metamaterial (MTM) (e.g., refer to exemplary phase-array antenna 1000 of FIG. 10). A metastructure, as generally described herein, is an engineered structure capable of controlling and manipulating incident radiation at a desired direction based on its geometry. In addition, it should be noted that, in some examples, lasers and/or detectors may be employed by the disclosed antenna system 100 instead of phased-array antennas 120, as is shown in FIG. 1.

The rearrangeable switch network 104, or configurable network, is used for signal source permutation. The power distribution network 110 is a multi-port amplification (MPA) system, and is responsible for power distribution and power level control of the beams 130. This feature of power distribution and control may also offer redundancy protection. It should be noted that there may be a variety of different designs for the power distribution network 110, such as designs utilizing hybrid de-couplers and power amplifiers.

FIGS. 2 and 3 illustrate switch networks 202, 204, according to examples of the present disclosure. Switch networks 202 and 204 are exemplary switch networks that may be employed for the rearrangeable switch network 104 of the power switching and distribution network 105 of FIG. 1. Switch networks 202 and 204 are each a Benes network comprising multiple base unit switches (e.g., two-by-two (2×2) switches, such as a cross-bar switches) coupled together. These switch networks 202, 204 incorporate base unit switches that may be rearranged (e.g., by various switching combinations) without blocking the signal flow through the switch networks 202, 204. This ensures that the switch networks 202, 204 are capable of full-throughput as signals (e.g., containing data packets) are switched through the networks 202, 204 with various routings. There are a variety of techniques that may be utilized for such routing. As illustrated, this type of network (e.g., Benes network) enables a configuration that satisfies a variety of scenarios without interruption of information or signal flow through the switch networks 202, 204. A switch network 202, 204 for the rearrangeable switch network 104 may be constructed to support any number of input-to-output ports (e.g., switch network 202 is constructed to have four inputs and four outputs, and switch network 204 is constructed to have eight inputs and eight outputs). The internal configurations of the switch networks 202, 204 are coupled to allow reconfiguration. As illustrated, the individual elements of networks 202 and 204 are 2×2 elements (e.g., 2×2 switches, such as a cross-bar switches). Alternate examples for the switch network 202, 204 of the rearrangeable switch network 104 may be implemented in a variety of sizes and/or configurations.

Figure 4:
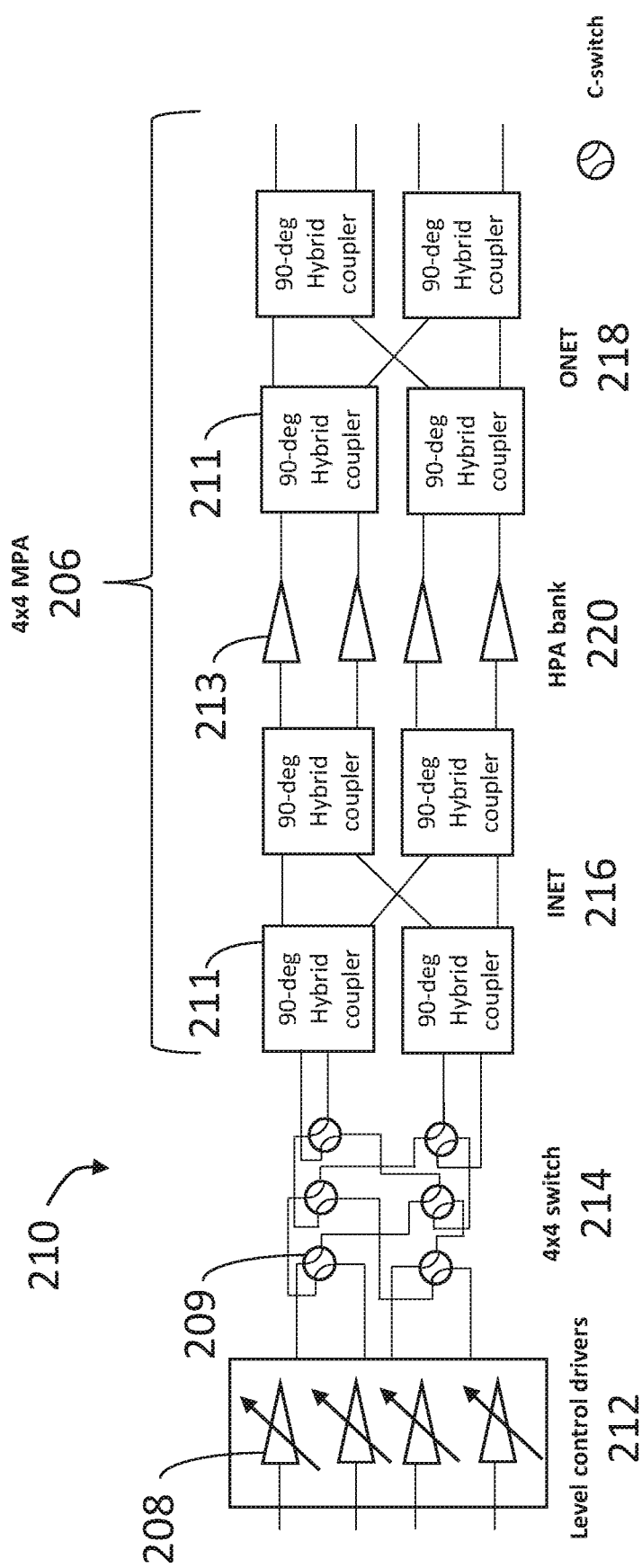
FIG. 4 illustrates an antenna system comprising a four-by-four (4×4) switch network, according to examples of the present disclosure.

FIG. 4 illustrates an antenna system 210 that is a 4×4 rearrangeable system comprising four level control drivers 208, a 4×4 switch network 214, a 4×4 MPA system 206, and four power amplifiers (e.g., HPAs) 213. The 4×4 switch network 214 is a rearrangeable switch network that supports any permutation of four inputs to four outputs. In some examples, the 4×4 switch network 214 includes six (6) C-switches, as is shown in FIG. 4. In other examples, various different types of switches other than C-switches may be employed for the switches of the 4×4 switch network 214 including, but not limited to, R-switches, T-switches, and/or cross-bar switches (e.g., refer to 200 and 202 of FIG. 2). In addition, the antenna system 210 may be scaled to support any number of inputs to outputs. As such, various different switch networks having various different number of inputs and outputs may be employed instead of a 4×4 switch network 214 for the antenna system 210.

The 4×4 switch network 214 is coupled to the MPA system 206. In some examples, MPA system 206 is a matrix amplification network of multiple matrices, where each matrix has M number of input ports and M number of output ports (e.g., M-by-M (M×M) matrices), where M may be equal to two, four, eight, or etc. (M=2, 4, 8, or etc.). The output of a first matrix, referred to as an input network (INET) 216, is input to a power amplifier array (e.g., a high power amplifier (HPA) bank) 220 of M similar (or identical) power amplifiers (e.g., high power amplifiers (HPAs), such as traveling-wave tube amplifiers (TWTAs) and/or solid state power amplifiers (SSPAs)) 213. The power amplifier array 220 provides M number of inputs into a second matrix, referred to as an output network (ONET) 218, that are the outputs of the power amplifiers 213. The ONET 218 separates the M number of amplified signals into M number of streams at M number of outputs. The INET 216 and the ONET 218 may be recursively constructed using ninety-degree hybrid couplers 211. As such, the INET 216 is a first set of hybrid couplers, and the ONET 218 is a second set of hybrid couplers.

The matrix structure of the power distribution network 110 (e.g., MPA system 206) uses control of the input levels to the power amplifiers (e.g., high power amplifiers (HPAs)) 213 to control the output levels of the power amplifiers 213. Each of the output ports of the power amplifiers 213 correspond to a different beam 130. By adjusting the input power levels to the INET 216, the output levels of the power amplifiers 213 will be adjusted, and a dynamic and reconfigurable power distribution over the beams 130 may be achieved. This feature is highly desirable, for example, in high frequency operations, such as for Ka-band and Q/V-band. However, other frequencies may be utilized for the disclosed antenna system 100 including, but not limited to, L-band, C-band, S-band, X-band, and Ku-band.

In some examples, the MPA system 206 provides failure resiliency properties. For example, when N number of power amplifiers 213 within the M-dimensional power amplifier array 220 are in an off mode (e.g., an N number of the power amplifiers 213 are not operating) there will be no interruption of operation for the remaining power amplifiers 213 (i.e. M minus N (M-N) number of the power amplifiers 213 will remain operating, for example due to failure or loss of power). These remaining power amplifiers 213 will continue to work for all M number of paths of the MPA system 206, but with a lower power. The power level will be reduced by a factor of (M-N)/M in some examples. As such, power combining and power dividing may be achieved through control of the individual elements of the MPA system 206. These solutions may be used to implement multi-cast or broadcast messaging and communications. For example, the antenna system 100 of FIG. 1 may be implemented in a multi-beam satellite system (e.g., refer to 605 of FIG. 6A) and/or a wireless cellular system (e.g., refer to 655 of FIG. 6B).

Also in FIG. 4, the INET 216 and the ONET 218 are each shown to comprise a 4×4 configuration of ninety-degree hybrid couplers 211. In addition, the power amplifier array (e.g., a HPA bank) 220 is shown to comprise four power amplifiers (e.g., HPAs) 213. However, it should be noted that in some examples, the power amplifier array (e.g., a HPA bank) 220 may comprise additional power amplifiers (e.g., HPAs) 213 for added redundancy (e.g., refer to 220 and 222 of FIG. 5).

In some examples, the present disclosure implements rearrangeable networks for beam steering and switching on-board a satellite for high data rate space links with high-gain phased array antennas. Phased array antennas, compared to classical satellite antennas using large size reflectors with mechanical beam steering subsystems, present several advantages, including mass and form factor reduction, electronic beam steering and switching.

Figure 5:
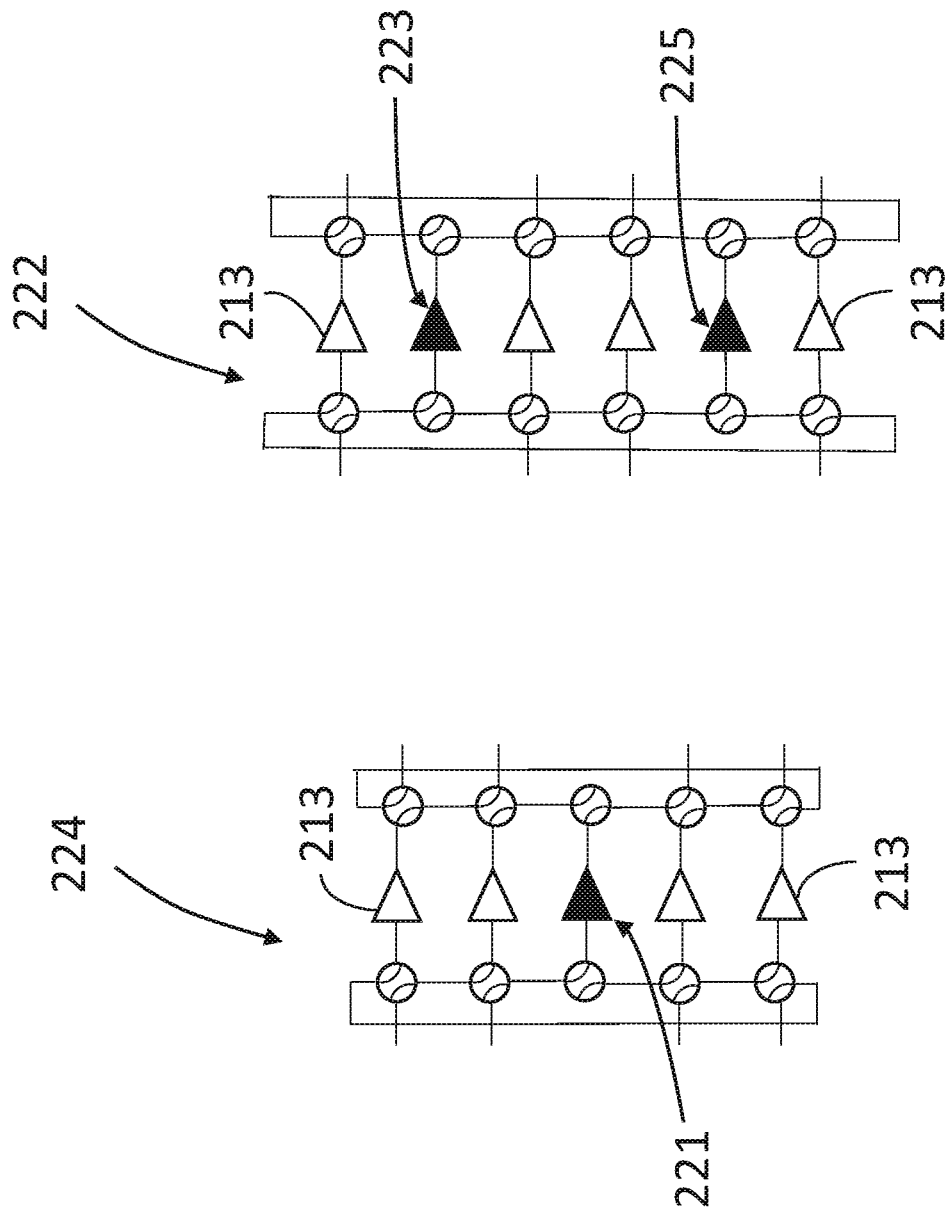
FIG. 5 illustrates power amplifier banks comprising redundant power amplifiers, according to examples of the present disclosure.

FIG. 5 illustrates power amplifier (e.g., HPA) banks 224, 222 comprising redundant power amplifiers (e.g., HPAs) 221, 223, 225, according to examples of the present disclosure. In some examples, the power amplifier banks 224, 222 may be employed for the power amplifier array (e.g., a HPA bank) 220 of the antenna system 210 for added redundancy. Also, in some examples, these power amplifier banks 220, 222 may each be implemented as a small cell backhaul configuration for a cellular system, such as for 5G specifications.

As shown in FIG. 5, power amplifier bank 224 is a single redundant amplifier configuration having an additional redundant power amplifier 221 with four inputs and four outputs. As such, for power amplifier bank 224, one power amplifier 213 failure is recoverable without interruption. And, power amplifier bank 222 is a double redundant amplifier configuration having two additional redundant power amplifiers 223, 225 with four inputs and four outputs. As such, for power amplifier bank 222, two power amplifier 213 failures are recoverable without interruption.

Figure 6A:
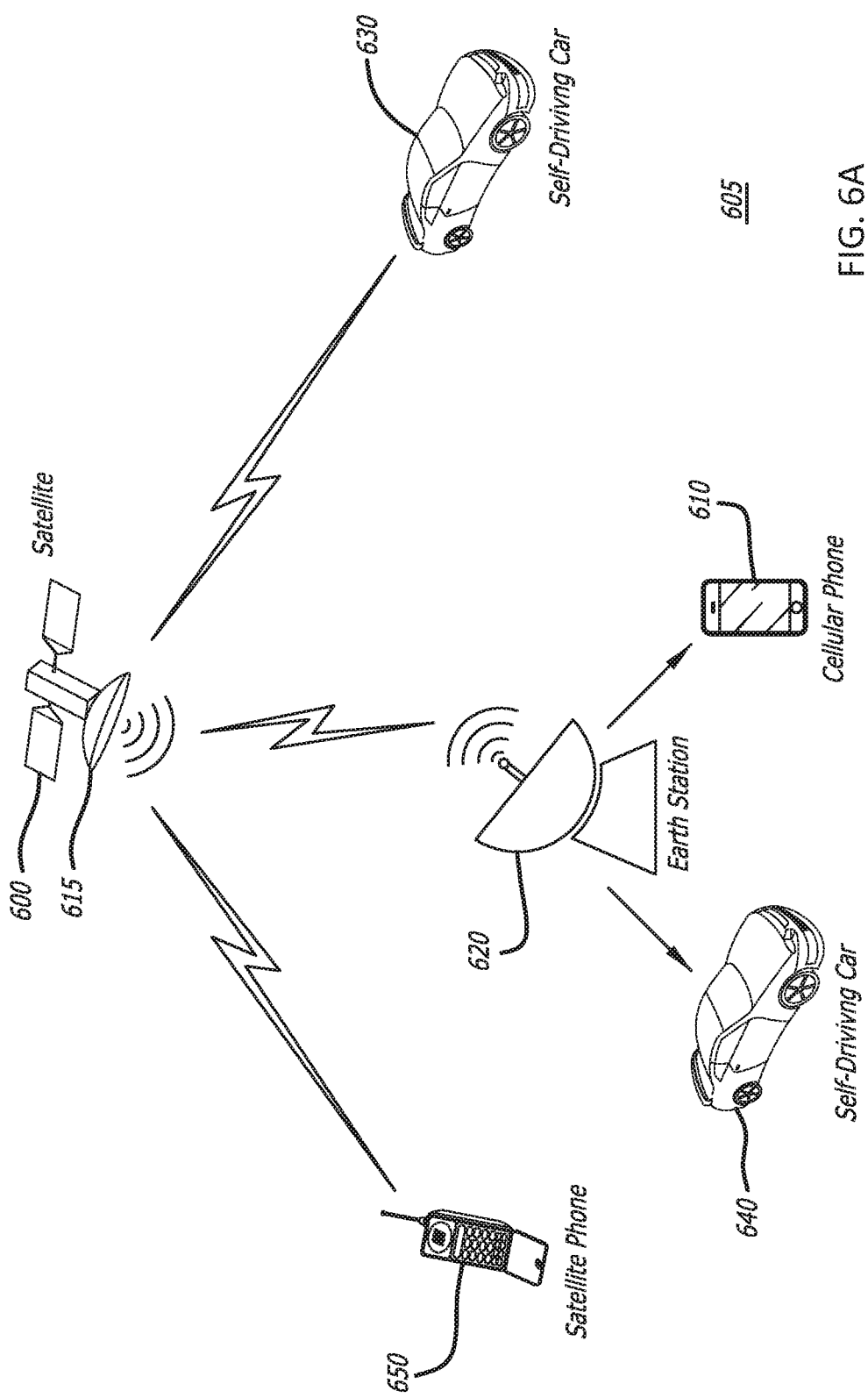
FIG. 6A illustrates a satellite communication system, according to examples of the present disclosure.

FIG. 6A illustrates a satellite communication system 605, according to examples of the present disclosure. In this figure, the satellite communication system 605 is shown to comprise a satellite 600, a ground station (earth station) 620, a satellite phone 650, a cellular phone 610, and self-driving cars 630, 640. In one or more examples, the satellite 600 of FIG. 6A may employ the disclosed antenna systems 100 and 210 of FIGS. 1 and 4.

The satellite communication system 605 may be utilized for communications for calls with the satellite phone 650 and/or the cellular phone 610, and/or for communicating with (e.g., commanding) self-driving cars 630, 640, which may include other types of self-driving vehicles. During operation, the antenna(s) 615 on satellite 600 transmits and/or receives signals (comprising communications) to the satellite phone 650, the ground station 620, and/or the self-driving car 630. The satellite phone 650 and self-driving car 630 receive communications directly from the satellite 600. The ground station 620 acts as a relay to transmit and/or receive the signals to the self-driving car 640 and/or the cellular phone 610.

Figure 6B:
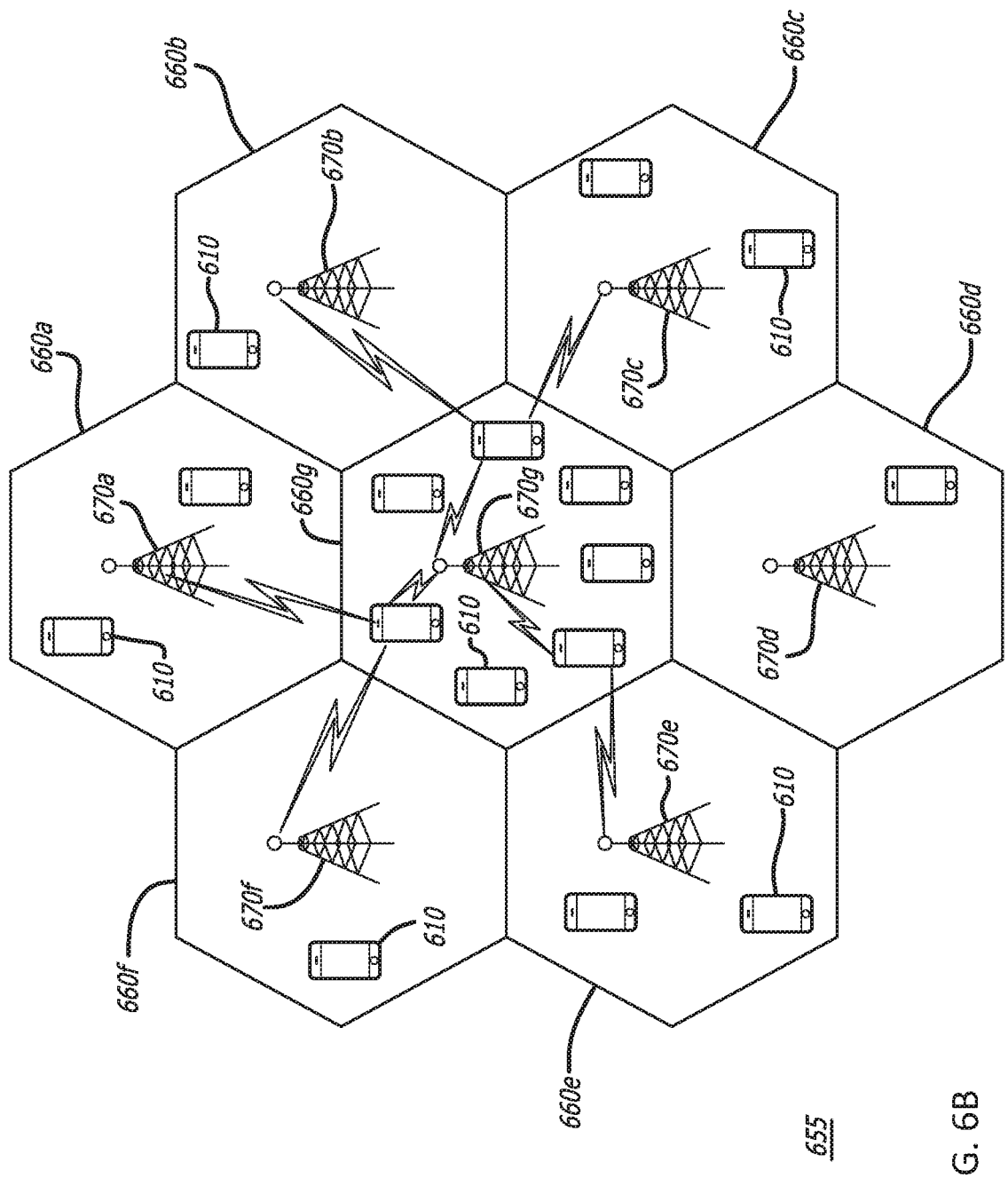
FIG. 6B illustrates a cellular communication system, according to examples of the present disclosure.

FIG. 6B illustrates a cellular communication system 655, according to examples of the present disclosure. In this figure, the cellular communication system 655 includes an array of cells 660a-660g, where each cell 660a-660g is shown to comprise a respective cellular base station 670a-670g. In one or more examples, each cellular base station 670a-670g may employ the disclosed antenna systems 100 and 210 of FIGS. 1 and 4. Each of the cellular base stations 670a-670g provides communications to cellular phones 610 that are located within its respective cell 660a-660g and/or to cellular phones 610 that are located in neighboring cells 660a-660g.

Figure 7:
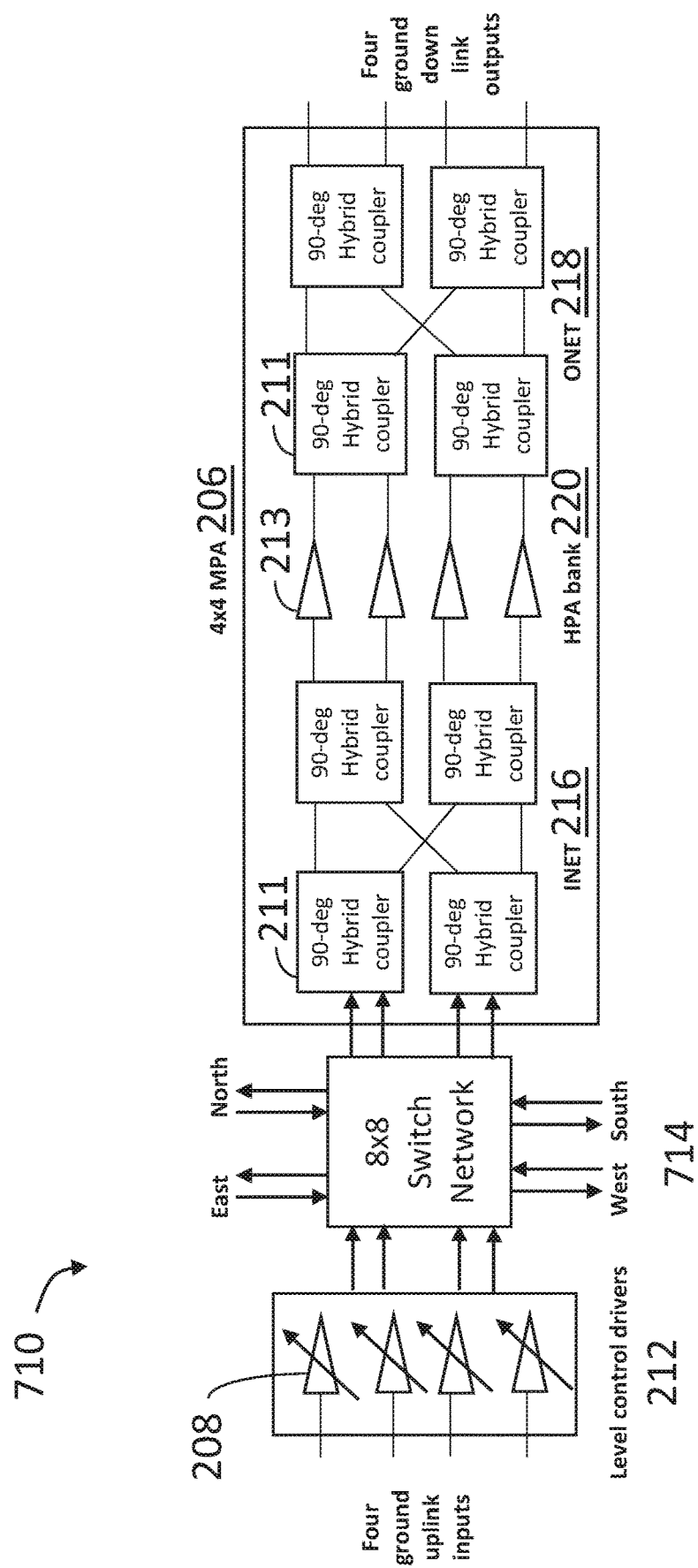
FIG. 7 illustrates an antenna system comprising an eight-by-eight (8×8) switch network, according to examples of the present disclosure.

FIG. 7 illustrates an antenna system 710 comprising an eight-by-eight (8×8) switch network 714, according to examples of the present disclosure. The antenna system 710 of FIG. 7 is similar to the antenna system 210 of FIG. 4, except that the antenna system 710 of FIG. 7 comprises an 8×8 switch network 714 instead of a 4×4 switch network 214 as is in the antenna system 210 of FIG. 4. The 8×8 switch network 714 combined with an 4×4 MPA 206 matrix provide an efficient solution for a low earth orbit (LEO) satellite (e.g., refer to satellite 800 of FIG. 8).

Figure 8:
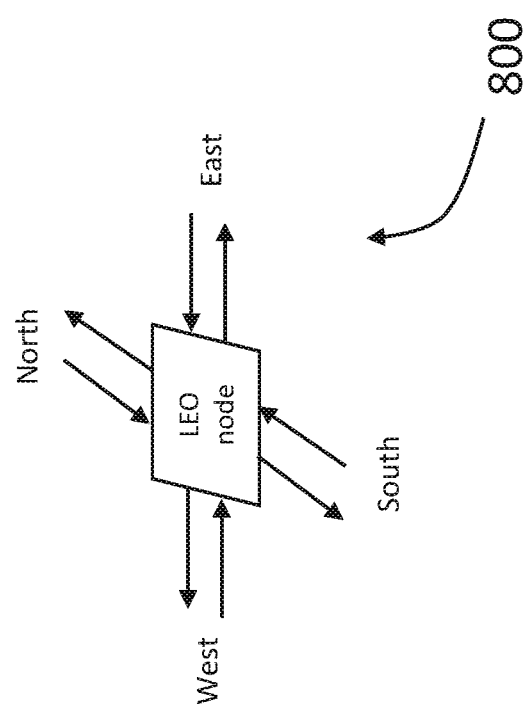
FIG. 8 illustrates a low earth orbiting (LEO) satellite, according to examples of the present disclosure.

FIG. 8 illustrates a low earth orbit (LEO) satellite 800, according to examples of the present disclosure. In this figure, the LEO satellite comprises four ground steerable beams and four switching beams (referred to as the north, the south, the east and the west beams) for connectivity with both ground stations (e.g., refer to 620 of FIG. 6A) and four neighboring LEO satellites in a typical constellation (e.g., refer to the constellation of LEO satellites 900a-900i in FIG. 9). In some examples, the LEO satellite 800 may employ the antenna system 710 comprising an 8×8 switch network 714. The 8×8 switch network 714 may be used to control (e.g., steering and power) the beams (i.e. the north, south, east, and west beams) of the LEO satellite 800.

It should be noted that, in some examples of the present disclosure, various different types of satellites may employ the disclosed antenna systems 100, 210, 710 other than a LEO satellite 800 including, but not limited, to medium earth orbit (MEO) satellites, geosynchronous earth orbit (GEO) satellites, and satellites of different orbits.

Figure 9:
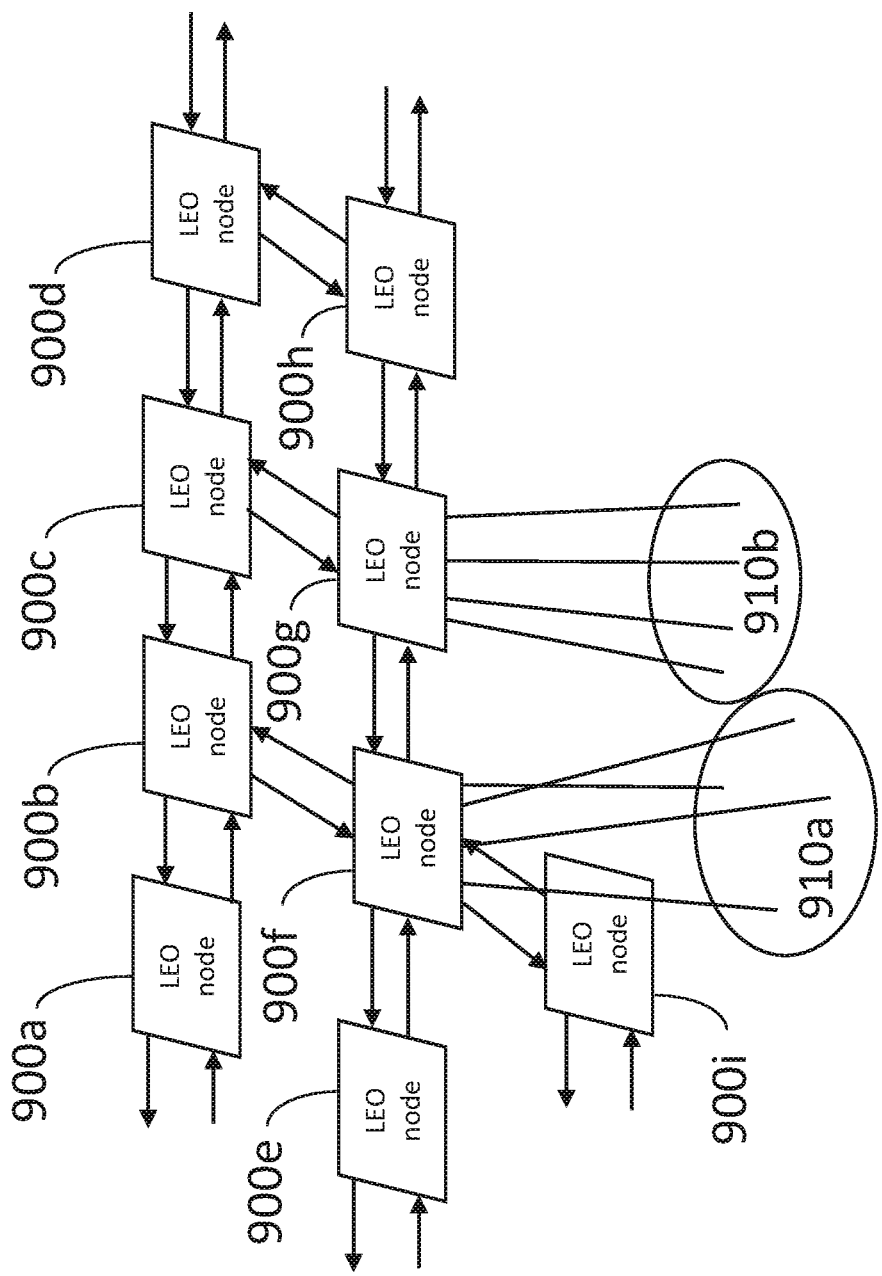
FIG. 9 illustrates a LEO satellite constellation, according to examples of the present disclosure.

FIG. 9 illustrates a LEO satellite constellation, according to examples of the present disclosure. The LEO satellite constellation is shown to comprise a plurality of LEO satellites 900a-900i. In one or more examples, each of the LEO satellites 900a-900i of the LEO satellite constellation of FIG. 9 may employ the antenna system 710 of FIG. 7 for beam switching and power dispatching to ensure ground coverage and global connectivity.

In the case where routing is to be established from a ground beam 910a of a LEO satellite 900f to another ground beam 910b located in another area or continent that is associated with another LEO satellite 900g, the disclosed antenna system 710 is able to easily meet this operational requirement by providing a link from the beam 910a to beam 910b through LEO satellite 900f and LEO satellite 900g. The signal routing is thus established from the LEO satellite 900f to the destination LEO satellite 900g.

The disclosed antenna system 710 may be used for other scenarios (including, but not limited to, disaster recovery, catastrophic handling, extreme weather, day to night traffic shifting, and many others), where the proposed beam steering mechanism based on a switch network 714 combined with an MPA system 206, which would be deployed in a satellite payload, is more advantageous as compared to a conventional design because of its ability to provide fast switching of beams and dynamic beam power reconfigurability.

Figure 10:
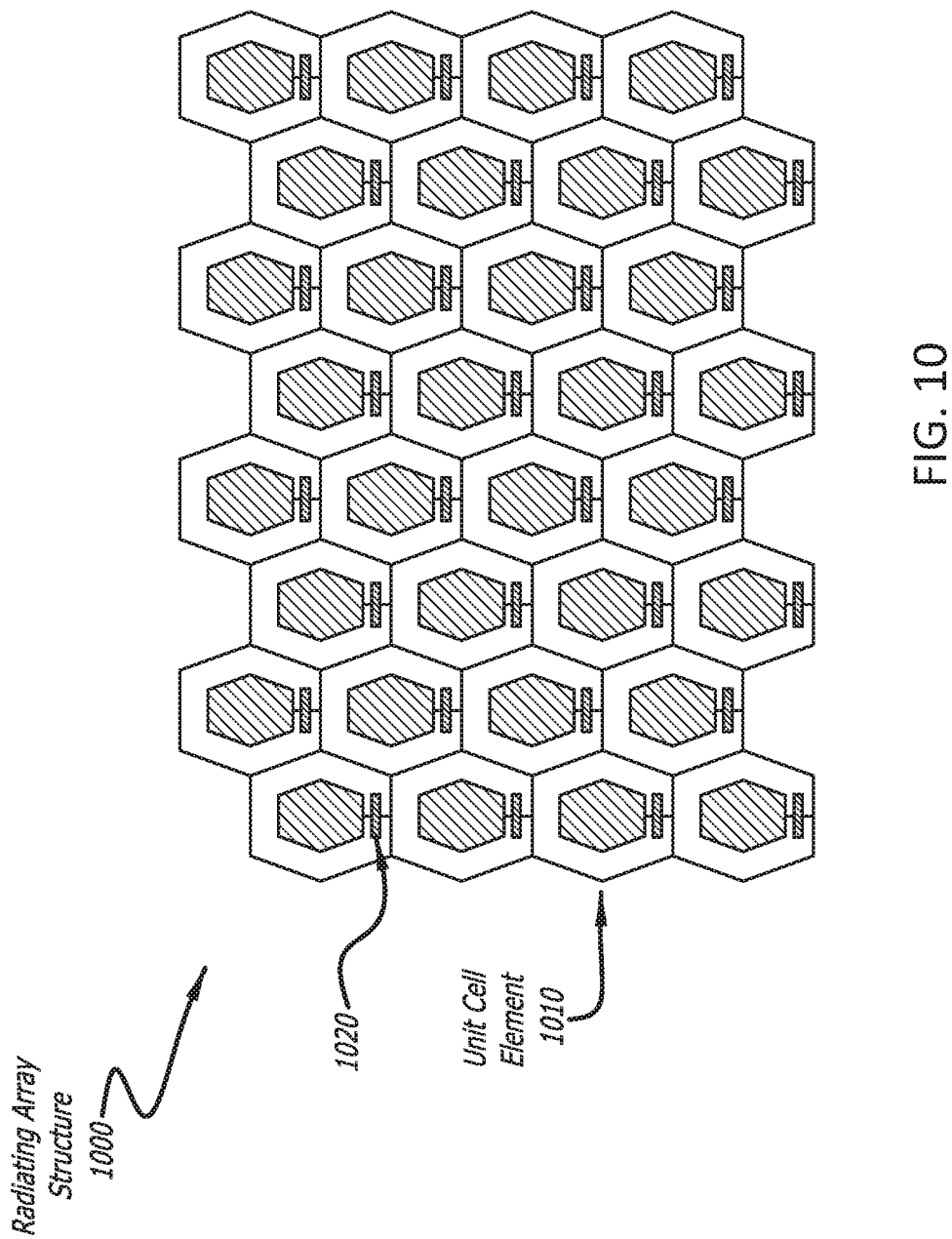
FIG. 10 illustrates a phased-array antenna, according to examples of the present disclosure.

FIG. 10 illustrates a phased-array antenna 1000, according to examples of the present disclosure. The phased-array antenna (radiating array structure) 1000 of FIG. 10 may be employed for the phase-array antennas 120 in FIG. 1. The phase-array antenna 1000 of FIG. 10 may be made up of a lattice of repeating hexagonal unit cell elements 1010. Each hexagonal unit cell element 1010 is manufactured to comprise a metamaterial (MTM). Each hexagonal unit cell element 1010 is designed to radiate at the transmission signal frequency, where each hexagonal unit cell element 1010 is the same size and shape. The hexagonal shape of the unit cell elements 1010 is conducive to dense configurations optimizing the use of space and reducing the size of a conventional antenna.

The signal radiating from a given hexagonal unit cell element 1010, or group of hexagonal unit cell elements 1010, radiates at a specific phase that is controlled by a reactance control element 1020, which may be a variable capacitive diode, or varactor. In such an example, the varactor changes a capacitive behavior of the radiating hexagonal unit cell element 1020 to achieve a phase change or shift in the transmission signal. By phase shifting the transmission signal from individual radiating hexagonal unit cell elements 1010, the phased-array antenna 1000 forms a specific beam (e.g., refer to beams 130 in FIG. 1) in a specific direction.

In FIG. 10, each hexagonal unit cell element 1010 is shown to comprise a reactance control element 1020. However, in other examples, some or none of the hexagonal unit cell elements 1010 comprise a reactance control element 1020. Alternative shapes and configurations for the unit cell elements 1010 may be used in alternative examples to build a lattice array of radiating unit cell elements 1010 for the phased-array antenna 1000 as a function of design parameters and desired performance.

Figure 11:
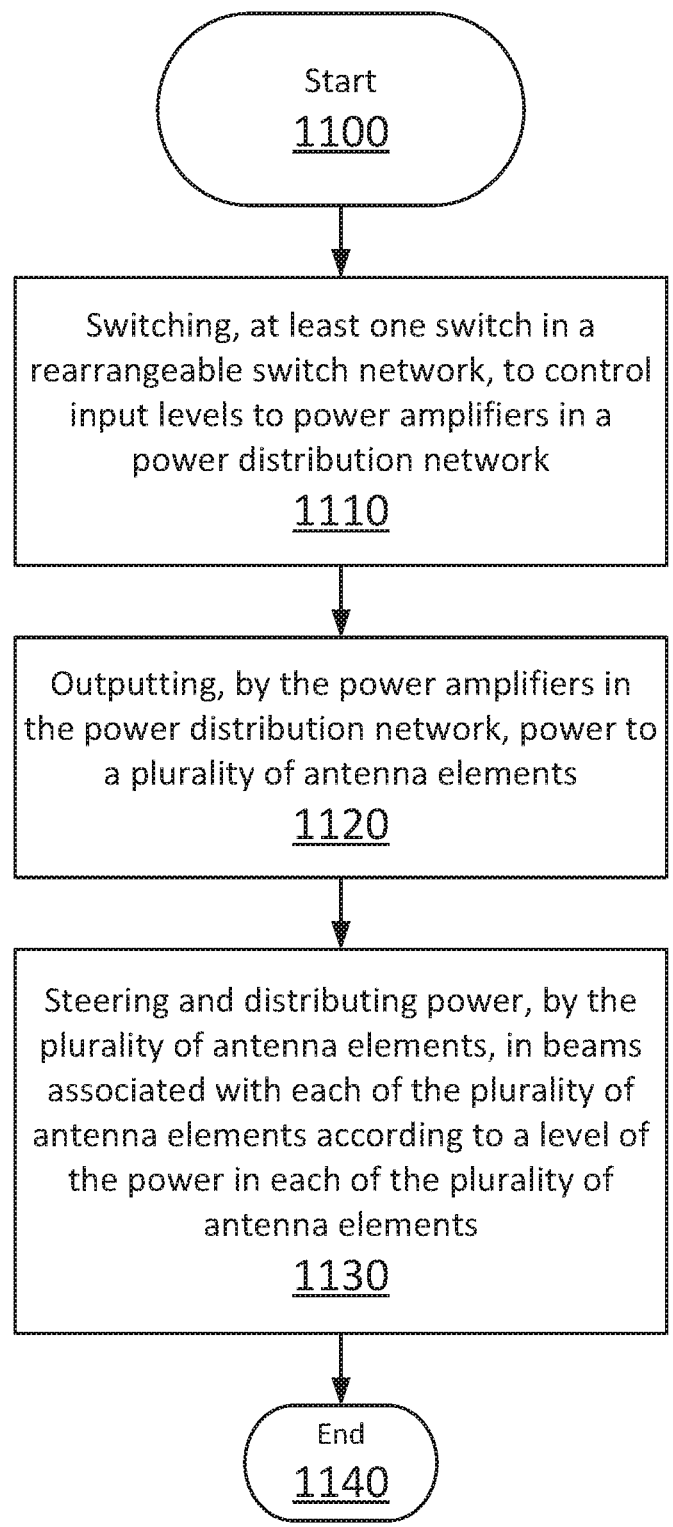
FIG. 11 illustrates a flow chart for a method for operating the disclosed antenna system, according to examples of the present disclosure.

FIG. 11 illustrates a flow chart for a method for operating the disclosed antenna system (e.g., a communication system), according to examples of the present disclosure. At the start 1100 of the method, at least one switch in a rearrangeable switch network is switched to control input levels to power amplifiers in a power distribution network 1110. Then, the power amplifiers in the power distribution network output power to a plurality of antenna elements 1120. The plurality of antenna elements steer and distribute power in beams associated with each of the plurality of antenna elements according to a level of the power in each of the plurality of antenna elements 1130. Then, the method ends 1140.

The present disclosure proposes and discloses methods and apparatuses to compensate for antenna gain loss with steered beam on-board a satellite, where phased array antennas are used. Efficient beam switching capability is combined with the said beam steering gain loss compensation feature in the example.

Although particular examples have been shown and described, it should be understood that the above discussion is not intended to limit the scope of these examples. While examples and variations of the many aspects of the disclosure have been disclosed and described herein, such disclosure is provided for purposes of explanation and illustration only. Thus, various changes and modifications may be made without departing from the scope of the claims.

Where methods described above indicate certain events occurring in certain order, those of ordinary skill in the art having the benefit of this disclosure would recognize that the ordering may be modified and that such modifications are in accordance with the variations of the present disclosure. Additionally, parts of methods may be performed concurrently in a parallel process when possible, as well as performed sequentially. In addition, more steps or less steps of the methods may be performed.

Accordingly, examples are intended to exemplify alternatives, modifications, and equivalents that may fall within the scope of the claims.

Although certain illustrative examples and methods have been disclosed herein, it can be apparent from the foregoing disclosure to those skilled in the art that variations and modifications of such examples and methods can be made without departing from the true spirit and scope of this disclosure. Many other examples exist, each differing from others in matters of detail only. Accordingly, it is intended that this disclosure be limited only to the extent required by the appended claims and the rules and principles of applicable law.

What is claimed is:

1. A communication system, comprising:
a transceiver module;
a rearrangeable switch network comprising output ports and coupled to the transceiver module;
a power distribution network coupled to the output ports of the rearrangeable switch network, the power distribution network comprising a plurality of power amplifiers, wherein the power distribution network is a multi-port amplification (MPA) matrix comprising:
a first set of hybrid couplers;
a second set of hybrid couplers coupled to the plurality of antenna elements; and
a power amplifier bank connected to the first set of hybrid couplers and the second set of hybrid couplers, wherein the power amplifier bank includes the plurality of power amplifiers; and
a plurality of antenna elements, each coupled to the power distribution network.

2. The communication system of claim 1, wherein the rearrangeable switch network further comprises a Benes network.

3. The communication system of claim 1, wherein the rearrangeable switch network further comprises one of C-switches, R-switches, T-switches, or cross-bar switches.

4. The communication system of claim 1, further comprising a bank of level control drivers connected to the rearrangeable switch network.

5. The communication system of claim 1, wherein the first set of hybrid couplers and the second set of hybrid couplers both comprise ninety-degree hybrid couplers.

6. The communication system of claim 1, wherein the first set of hybrid couplers and the second set of hybrid couplers each comprise M number of inputs and M number of outputs, wherein M is an integer.

7. The communication system of claim 1, wherein the plurality of power amplifiers are high power amplifiers (HPAs).

8. The communication system of claim 7, wherein the HPAs are one of traveling wave tube amplifiers (TWTAs) or solid state power amplifiers (SSPAs).

9. The communication system of claim 1, wherein the power amplifier bank comprises at least one redundant power amplifier.

10. The communication system of claim 1, wherein at least one of the antenna elements transmits or receives electromagnetic (EM) signals in beams.

11. The communication system of claim 10, wherein the electromagnetic signals comprise at least one of L-band, S-band, C-band, X-band, Ku-band, Ka-band, or Q/V-band frequencies.

12. The communication system of claim 1, wherein the plurality of antenna elements are phased-array antenna elements.

13. The communication system of claim 1, wherein the plurality of antenna elements comprise at least one metamaterial (MTM).

14. The communication system of claim 1, wherein the communication system is employed in one of a satellite or a cellular base station.

15. The communication system of claim 14, wherein the satellite is one of a low earth orbit (LEO) satellite, a medium earth orbit (MEO) satellite, or a geosynchronous earth orbit (GEO) satellite.

16. A communication system comprising:
a transceiver module;
level control drivers coupled to the transceiver module;
a switch network coupled to the level control drivers, the switch network having M number of input ports and M number of output ports, wherein M is an integer;
a power distribution network having M number of input ports and M number of output ports, the input ports of the power distribution network coupled to the output ports of the switch network, the power distribution network having a plurality of power amplifiers and hybrid couplers; and
a plurality of antenna elements directly coupled to the power distribution network, wherein each output of the plurality of power amplifiers corresponds to a single one of the plurality of antenna elements.

* * * * *